United States Patent [19]

Tanigawa

[11] Patent Number: 4,808,856
[45] Date of Patent: Feb. 28, 1989

[54] LOW VOLTAGE PHASE COMPARATOR

[75] Inventor: Hiroshi Tanigawa, Saitama, Japan

[73] Assignee: Toko, Inc., Japan

[21] Appl. No.: 97,612

[22] Filed: Sep. 16, 1987

[30] Foreign Application Priority Data

Sep. 19, 1986 [JP] Japan ............................ 61-221181

[51] Int. Cl.$^4$ ........................ H03D 13/00; H03K 9/06
[52] U.S. Cl. .................................... 307/511; 328/133;
328/155; 307/262
[58] Field of Search ............... 307/511, 494, 514, 262;
328/133, 109, 155, 55; 330/288

[56] References Cited

U.S. PATENT DOCUMENTS

| 3,863,080 | 1/1975 | Steckler | 328/133 |
| 4,001,603 | 1/1977 | Wilcox | 328/133 |
| 4,629,914 | 12/1986 | Okanobu | 328/155 |

*Primary Examiner*—Stanley D. Miller
*Assistant Examiner*—Timothy P. Callahan

[57] ABSTRACT

A phase comparator which comprises a differential amplifier; and a first and a second active load circuit each comprising a current mirror circuit and from which is derived an output signal which is reversed in phase with respect to the output of the differential amplifier. The outputs of the respective active load circuits are superimposed upon each other through other current mirror circuits, and an output resulting from the superimposition is alternately provided based on rectangular waveform signals which are reversed in phase with respect to each other. By smoothing the output, a DC output corresponding to the phase shift of input signal from the rectangular waveform signals is produced. The phase comparator comprises a combination of transistors and diodes which are cascode-connected to each other, and thus is operable with a predetermined voltage as low a 1 V or less.

2 Claims, 4 Drawing Sheets

LOW VOLTAGE PHASE COMPARATOR

BACKGROUND OF THE INVENTION

1. Field of the Invention

This invention relates to a phase comparator which is well adaptable for a low voltage used in a PLL (Phase Locked LOOP) circuit and so forth.

2. Description of the Prior Art

In order to have a better understanding of the present invention, description will first be made of a conventional phase comparator with reference to FIG. 1 of the accompanying drawings, which a pair of differential amplifiers in combination. More specifically, the phase comparator shown in FIG. 1 comprises a differential pair of transistors Q30, Q31 and a current source transistor Q32; a second differential pair of transistors Q33, Q34 and a current source transistor Q35; a constant current source circuit 20 comprising transistors Q36 and Q37; and load resistors R5, R6.

Input signal is supplied to the bases of the transistors Q32 and Q35 (input terminals 25 and 26) so that the proportion of bias currents for these two transistors is thereby controlled. The two differential pairs of transistors Q30, Q31 and Q33, Q34 are provided at their bases with oscillation output of a voltage-controlled oscillator (VCO) or the like from terminals 23 and 24, so as to be alternately rendered operative so that an output corresponding to the phase difference between the input signal and the oscillation output of the voltage-controlled oscillator is obtained at output terminals 21 and 22. By smoothing the output obtained at the output terminals 21 and 22, a DC output corresponding to the phase difference is provided. When the phase difference of the input signal from the output of the voltage-controlled oscillator is 0°, for example, the DC output is positive; when the phase different is 90°, the DC output is zero; and when the phase difference is 180°, the DC output is negative.

Recently, it has been a common trend that portable radio receiver or the like is designed to operable with a lower voltage; thus it has been required that stable operation be able to be performed with a power source voltage equal to or lower than 1V. With the conventional phase comparator shown in FIG. 1 wherein the phase difference is detected by alternately switching the current source transistors Q32 and Q35 by means of the differential transistor pairs Q30, Q31 and Q33, Q34 respectively, however, it is required that bias voltage applied to the bases of the transistors Q30 to Q36 be higher than the sum of the base-emitter voltage VBE of the transistor Q30 and the collector-emitter saturation voltage VCE(sat), i.e., (VBE+2VCE(sat)). More specifically, assuming that VBE is 0.7V and that VCE(sat) is 0.2V, then the sum becomes as high as about 1.1V; thus, difficulties have been experienced in an attempt to operate the above-mentioned conventional phase comparator with a power source voltage equal to or lower than 1V.

SUMMARY OF THE INVENTION

The present invention has been made with a view to overcoming the above-mentioned problems with the prior art. It is a primary object of the present invention to provide a phase comparator which is operable with a power source voltage as low as 1V or less.

Briefly stated, according to an aspect of the present invention, there is provided a phase comparator comprising a differential amplifier; and a first and a second active load circuit each comprising a current mirror circuit and from which is derived an output signal which is reversed in phase with respect to the output of the differential amplifier, wherein the outputs of the respective active load circuits are superimposed upon each other through other current mirror circuits, and an output resulting from the superimposition is alternately provided based on rectangular waveform signals which are reversed in phase with respect to each other, and wherein by smoothing the output, a DC output corresponding to the phase shift of input signal from the rectangular waveform signals is produced. The phase comparator comprises a combination of transistors and diodes which are cascode-connected to each other, and thus is operable with a predetermined voltage as low as 1V or less.

Other objects, features and advantages of the present invention will become apparent from the ensuing description taken in conjunction with the accompanying drawings.

DESCRIPTION OF THE PREFERRED EMBODIMENTS

With reference to FIGS. 2 to 6, description will now be made of the phase comparator according to an embodiment of the present invention.

Figure 1:
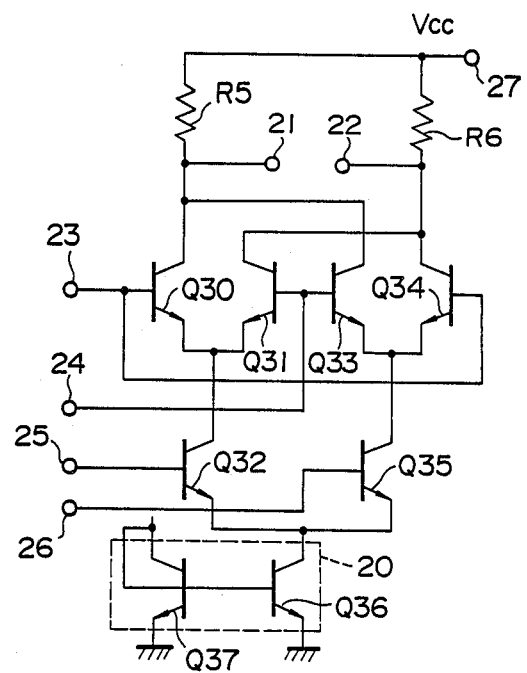
FIG. 1 is a circuit diagram showing a conventional phase comparator.
Figure 2:
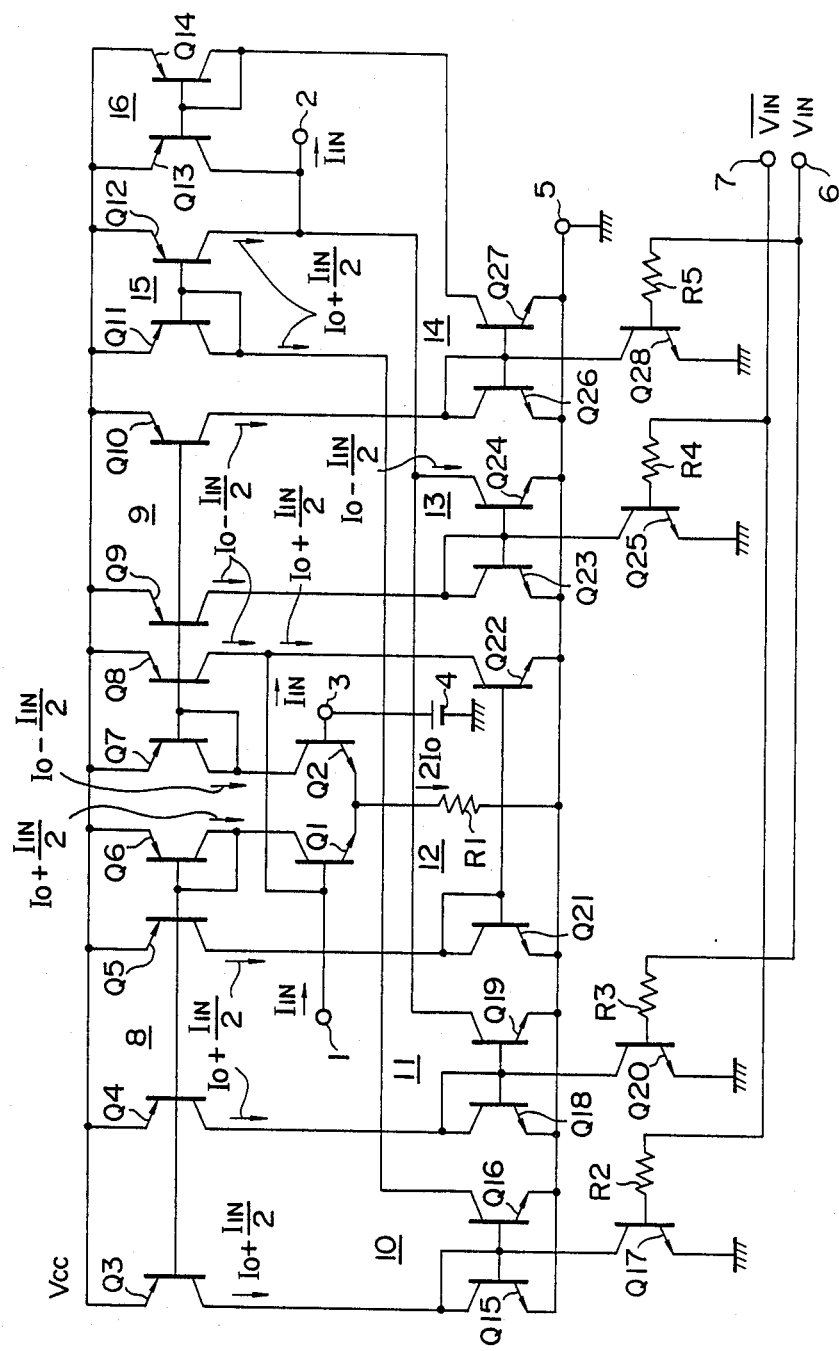
FIG. 2 is a circuit diagram showing the phase comparator according to an embodiment of the present invention.

Referring to FIG. 2, there is shown the phase comparator embodying the present invention, which includes an input terminal 1 to which an input signal is inputted; an output terminal 2; a second input terminal 3 to which a reference voltage is applied; a reference voltage source 4; a ground terminal 5; further input terminals 6 and 7 to which are applied rectangular waveform signals which are derived from a voltage-controlled oscillator (VCO) and opposite in phase to each other; and mirror circuits 8 to 16.

The phase comparator of FIG. 2 further includes a differential amplifier circuit which comprises a differential pair of transistors Q1 and Q2 having their emitters connected to a resistor R1; a first active load circuit constituted by the current mirror circuit 8 comprising transistors Q3 to Q6; and a second active load circuit constituted by the current mirror circuit 9 comprising transistors Q7 to Q10. The transistor Q1 has its base connected to the collector of the transistor Q8 and that of a transistor Q22 so that a negative feedback circuit is established by the differential amplifier circuit. The transistor Q5 has its collector connected to the collector and base of a transistor Q21 which is connected in a diode-like fashion. The transistors Q21 and Q22 constitute a current mirror circuit 12.

The output stage of the current mirror circuit 8 constituting the first active load circuit for the differential amplifier, comprises three transistors, i.e., Q3, Q4, Q5, wherein the transistors Q3 and Q4 have their collectors connected to the collectors of transistors Q15 and Q18, connected in diode-like fashion, of the current mirror circuits 10 and 11 so that mirror currents are supplied from the current mirror circuit 8 to the current mirror circuits 10 and 11. Transistor Q16 which constitutes the output stage of the current mirror circuit 10 has its collector connected to the collector of a transistor Q11, connected in a diode-like fashion, of the current mirror circuit 15. Transistor Q19 constituting the output stage of the current mirror circuit 11 has its collector connected to the collectors of transistors Q12 and Q13 constituting the output stages of the current mirror circuits 15 and 16 respectively.

The output stage of the current mirror circuit 9 constituting the second active load circuit, comprises three transistors Q8, Q9, Q10, wherein the transistors Q9 and Q10 have their collectors connected to the collectors and bases of transistors Q23 and Q26, both connected in diode-like fashion, of the current mirror circuits 13 and 14, respectively. Further, transistors Q24 and Q27 at the output stages of the current mirror circuits 13 and 14 have their collectors connected to the collector of a transistor Q13 and that of a transistor Q14 connected in a diode-like fashion, respectively, the transistors Q13 and Q14 constituting the current mirror circuit 16. The transistors Q12 and Q13 at the output stages of the current mirror circuits 15 and 16 have their collectors connected to the output terminal 2.

Switching transistors Q17, Q20, Q25 and Q28 have their collectors connected to the bases of the transistors constituting the current mirror circuits 10, 11, 13 and 14; the transistors Q17 and Q25 have their bases connected to the input terminal 7 through resistors R2 and R4; and the transistors Q20 and Q28 have their bases connected to the input terminal 6 through R3 and R5.

Figure 3:
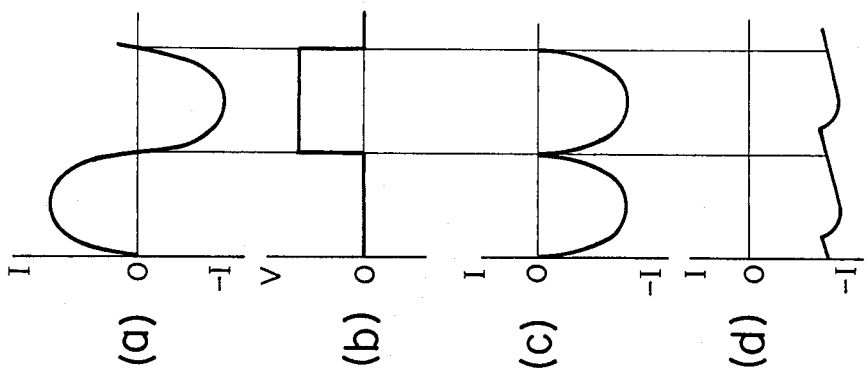
FIGS. 3 to 5 are views useful for explaining the operation of the phase comparator according to the present invention.

The operation of the phase comparator shown in FIG. 2 will now be explained with reference to operating waveforms shown in Figure 3. In operation, an AC signal such as shown at (a) in FIG. 3 is inputted to the input terminal 1, while switching rectangular waveform signals which are in reversed relationship to each other, are inputted to the input terminals 6 and 7 respectively. The signal waveform inputted to the input terminal 7 is shown at (b) in FIG. 3. If the rectangular waveform signal inputted to the input terminal 7 is a voltage signal of "0" level, then the switching transistors Q17 and Q25 will be turned off so that the current mirror circuits 10 and 13 will be rendered operative. In such a case, a voltage of "1" level will be applied to the input terminal 6 so that the switching transistors Q20 and Q28 will be turned on, and thus the current mirror circuits 11 and 14 will be rendered inoperative. Under such a condition, if an input signal IIN is inputted to the differential amplifier through the input terminal 1, then a current of (IO+IIN/2) will be caused to flow as collector current (load current) of the transistor Q1, and a current of (IO−IIN/2) will be caused to flow as collector current (load current) of the transistor Q2. The switching transistor Q20 will be turned on, so that the current mirror circuit 11 will be rendered inoperative. Thus, mirror current from the transistor Q4 will be prevented from flowing in the transistor Q18, while mirror current of (IO+IIN/2) will permitted to the collectors and bases of transistors Q15 and Q21 each of which is connected in a diode-like fashion. In this way, the transistor Q16 at the output stage of the current mirror circuit 10 will be made to draw in current of (IO+IIN/2) from the collector and base of the diode-connected transistor Q11. Mirror current of (IO+IIN/2) will now be caused to flow out of the collector of the transistor Q12 at the output stage of the current mirror circuit 15. The transistor Q12 of the current mirror circuit 15 has its collector connected to the collector of the transistor Q24 of the current mirror circuit 13, and the bias-side transistor Q23 of the current mirror circuit 13 has its collector and base connected to the collector of the transistor Q9 at the output stage of the current mirror circuit 9. Because of the mirror current of (IO - IIN/2) being flowing in the diode-connected transistor Q23 at the output stage of the current mirror circuit 13, mirror current of (IO - IIN/2) will be caused to flow in the collector of the transistor Q24. Because of mirror current of (IO+IIN/2) being caused to flow from the collector of the transistor Q12 of the current mirror circuit 15 into the collector of the transistor Q24 as well, however, an input signal component IIN will be caused to flow as excess current to the output terminal 2 as shown in at (c) in FIG. 3.

If switching signals reverse to the previous ones, i.e., a voltages of "038 level and "1" level are applied to the input terminals 6 and 7 respectively, then the current mirror circuits 11 and 14 will be rendered operative, while the current mirror circuits 10 and 13 will be rendered inoperative. Assuming that the negative portion of the AC signal shown at (a) in FIG. 3 is applied to the input terminal 1, then a current which is reverse in polarity to the shown waveform will be caused to flow through the active load circuit. More specifically, load current of the differential amplifier circuit will be prevented from flowing in the collectors and bases of the transistors Q15 and Q23 of the current mirror circuits 10 and 13 which have been rendered inoperative, while mirror currents of (IO−IIN/2) and (IO+IIN/2) will be caused to flow in the collectors and bases of the diode-connected transistors Q18 and Q26 of the current mirror circuits 11 and 14 respectively. Thus, the current mirror circuit 14 will operate to draw in mirror current of (IO+IIN/2) from the collector of the transistor Q13 at the output stage of the current mirror circuit 16. The transistor Q4 has its collector connected to the base and collector of the transistor Q18 of the current mirror circuit 11; thus, mirror current of (IO−IIN/2) will be caused to flow in the collector and base of the diode-connected transistor Q18, and mirror current of (IO−IIN/2) will be caused to flow in the collector of the transistor Q19. In this way, the mirror current of (IO−IIN/2) from the current mirror circuit 16 will be drawn in. Because of current of (IO+IIN/2) flowing out of the collector of the transistor Q13 of the current mirror circuit 16, however, a positive output current IIN such as shown at (c) in FIG. 3 will be caused to flow out of the output terminal 2.

Figure 4:
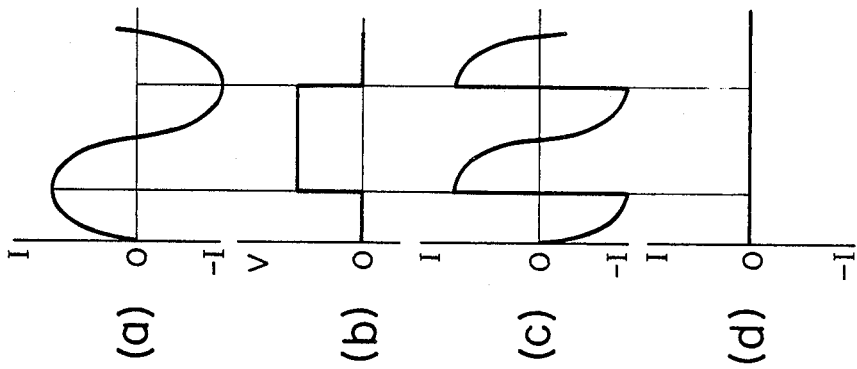
Figure 5:
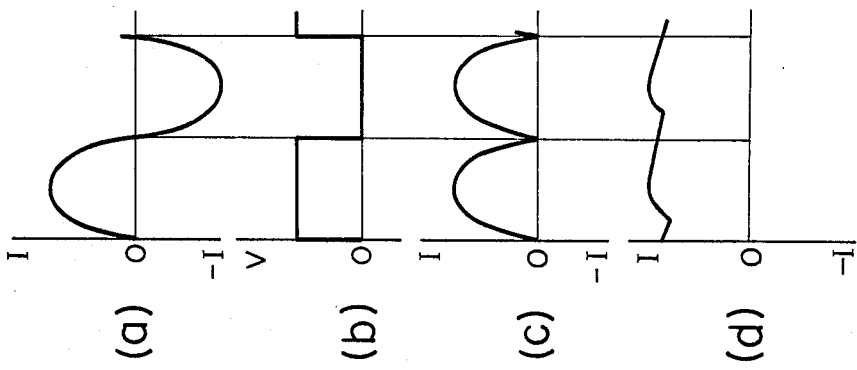

As will be appreciated from the above discussion, with the phase comparator according to the present invention, by virtue of the fact that the transistors Q12 and Q13 at the output stages of the current mirror circuits 15 and 16 have their collectors connected together, the current mirror circuits 15 and 16 will be alternately rendered operative on the basis of switching signals arriving at the input terminals 6 and 7, so that an output resulting from superimposition of the respective output currents flowing out of the current mirror circuits 15 and 16 will be obtained at the output terminal 2. By smoothing the this output, it is possible to obtain a DC output corresponding to the phase shift of the input signal relative to the switching signals. In FIGS. 3 to 5, (a) indicates the signal inputted via the input terminal 1; (b) indicates the switching signal of rectangular waveform supplied to the terminal 6; (c) represents the output waveform occurring at the output terminal 2; and (d) indicates the DC output obtained by smoothing the output at the output terminal 2. When the phase difference of the input signal from the signals imparted to the input terminals 6 and 7 is zero, the DC output is positive as shown at (d) in FIG. 3; when phase difference is 90° as in FIG. 4, the DC output is zero; and when the phase difference is 180° as in FIG. 5, the DC output is negative as shown at (d) in FIG. 5.

As will be appreciated from the above discussion, the phase comparator of this invention comprises a cascode-connection of the diode-connected transistors and the normally-connected transistors so as to be operable with the sum (VBE+VCE(sat)) of the base-emitter voltage VBE and the collector-emitter saturation voltage VCE(sat) of the transistors, i.e., with about 0.9V. Thus, the phase comparator according to this invention is most effectively operable with a low voltage. More specifically, the phase comparator of this invention is operable even with a supply voltage equal to or lower than 1V; thus it works most efficiently for PLL circuit or the like and can be most effectively used with an FM receiver or the like.

Figure 6:
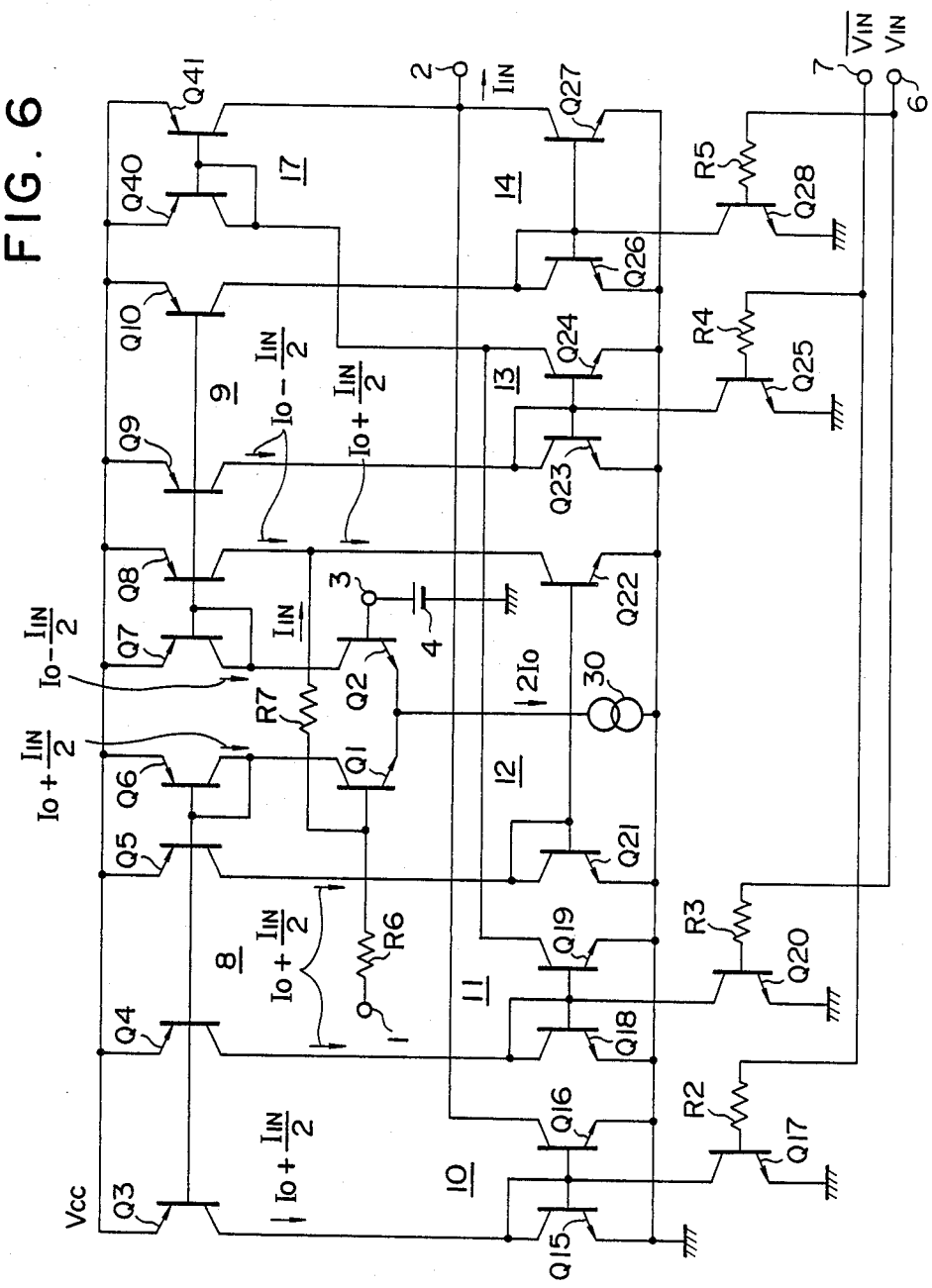
FIG. 6 is a circuit diagram showing the phase comparator according to a second embodiment of the present invention.

Referring to FIG. 6, there is shown the phase comparator according to another embodiment of this invention, wherein the current mirror circuits 15 and 16 provided in the embodiment shown in FIG. 2 is replaced with a single current mirror circuit 17. According to this embodiment, transistors Q16 and Q27 at the output stages of current mirror circuits 10 and 14 have their collectors connected together; transistors Q19 and Q24 at the output stages of current mirror circuits 11 and 13 have their collectors connected together; the connection point between the collectors of the transistors Q16 and Q27 is connected to the collector and base, i.e., the collector of a transistor Q41 of the current mirror circuit 17; and the connection point between the collectors of the transistors Q19 and Q24 is connected to the anode of a diode-connected transistor Q40 at the output stage of the current mirror circuit 17. The transistors Q41 and Q27 have their collectors connected together and thence to output terminal 2. The remaining arrangement of the phase comparator shown in FIG. 6 is similar to that shown in FIG. 2, except that a resistor R6 is connected at one end to input terminal 1 and at the other end to the base of a transistor Q1 the collector of a transistor Q8 at the output stage of an active load circuit 9; and a resistor R7 is connected at one end to the base of the transistor Q1 and at the other end to the collector of a transistor Q22 at the output stage of a current mirror circuit 12. It is also possible that additional resistors may be connected the emitters of the transistors Q3 to Q10, Q15, Q16, Q18, Q19, Q21, Q22 to Q24, Q26, Q27, Q40, and Q41 as desired.

As will be appreciated, the operation of the embodiment shown in FIG. 6 is similar to that of the embodiment shown in FIG. 2, and therefore further explanation thereof will be omitted.

While the present invention has been illustrated and described with respect to some specific embodiments thereof, it is to be understood that the invention is by no means limited thereto but encompasses all changes and modifications which will become possible within the scope of the appended claims.

I claim:

1. A phase comparator, comprising:
a differential amplifier having a first and a second input terminal to which an input signal and a reference signal are applied respectively;
a first and a second active load circuit, said load circuits being driven by said differential amplifier to provide output signals which are reversed in phase from each other, said first active load circuit including a first and a second output stage, said second active load circuit including a third and a fourth output stage;
a first and a second transistor provided at the first and the second output stages of said first active load circuit respectively;
a third and a fourth transistor provided at the third and the fourth output stages of said second active load circuit;
a first, a second, a third and a fourth current mirror circuit connected to the collectors of said first, second, third and fourth transistors at said first, second, third and fourth output stages, respectively;
a fifth current mirror circuit including a bias stage and an output stage including a transistor, said bias stage being connected to the collector of the transistor at the output stage of said first current mirror circuit, the output stage of said fifth mirror circuit being connected to the transistor at the output stage of said third current mirror circuit;
a sixth current mirror circuit including a bias stage and an output stage which comprises a transistor having its collector connected to the collector of the transistor at the output stage of said fifth current mirror circuit, the bias stage of said sixth mirror circuit being connected to the transistor at the output stage of said second current mirror circuit, the output stage of said sixth mirror circuit being connected to the collector of the transistor at the output stage of said fourth current mirror circuit;
an output terminal connected to a connection point between the collectors of the transistors at the output stages of said fifth and sixth current mirror circuits; and
means interconnecting said bias stages and providing that said first and said third current mirror circuits or said second and said fourth current mirror circuits are alternately rendered operative to output a signal at said output terminal corresponding to a phase shift between said input signal and said reference signal.

2. A phase comparator, comprising:
a differential amplifier having a first and a second input terminal to which an input signal and a reference signal are applied respectively;
a first and a second active load circuit, said load circuits being driven by said differential amplifier to provide output signals which are reversed in phase from each other, said first active load circuit including a first and a second output stage, said second active load circuit including a third and a fourth output stage;
a first and a second transistor provided at the first and the second output stages of said first active load circuit respectively;

a third and a fourth transistor provided at the third and the fourth output stages of said second active load circuit;

a first, a second, a third and a fourth current mirror circuit each including an output stage and being connected to the collectors of said first, second, third and fourth transistors at said first, second, third and fourth output stages, respectively, wherein the output stages of said first and fourth current mirror circuits include transistors having their collectors connected together, and the output stages of said second and third current mirror circuits include transistors having their collectors connected together;

a fifth current mirror circuit connected to a first connection point between the collectors of the transistors at the output stages of said first and fourth current mirror circuits, and connected further to a second connection point between the collectors at the output stages of said second and third current mirror circuits;

an output terminal connected to a third connection point between said fourth and said fifth current mirror circuits; and operating means for operating said first and third current mirror circuits or said second and fourth current mirror circuits alternately to output a signal at said output terminal corresponding to a phase shift between said input signal and said reference signal.

* * * * *